(12) United States Patent
Pham et al.

(10) Patent No.: US 10,205,394 B2
(45) Date of Patent: Feb. 12, 2019

(54) SWITCHED MODE POWER CONVERTER CONTROLLER WITH RAMP TIME MODULATION WITH JITTER FREQUENCY

(71) Applicant: Power Integrations, Inc., San Jose, CA (US)

(72) Inventors: Giao Minh Pham, Milpitas, CA (US); Vikram Balakrishnan, Mountain View, CA (US)

(73) Assignee: Power Integrations, Inc., San Jose, CA (US)

( * ) Notice: Subject to any disclaimer, the term of this patent is extended or adjusted under 35 U.S.C. 154(b) by 100 days.

(21) Appl. No.: 15/408,714

(22) Filed: Jan. 18, 2017

(65) Prior Publication Data

US 2018/0083540 A1    Mar. 22, 2018

Related U.S. Application Data

(60) Provisional application No. 62/395,874, filed on Sep. 16, 2016.

(51) Int. Cl.
| | |
|---|---|
| *H02M 1/08* | (2006.01) |
| *H02M 1/32* | (2007.01) |
| *H02M 3/00* | (2006.01) |
| *H03K 17/687* | (2006.01) |
| *H02M 3/335* | (2006.01) |
| *H02M 1/00* | (2006.01) |

(52) U.S. Cl.
CPC ......... *H02M 3/33507* (2013.01); *H02M 1/08* (2013.01); *H02M 1/32* (2013.01); *H02M 3/00* (2013.01); *H02M 3/33523* (2013.01); *H03K 17/687* (2013.01); *H02M 2001/0003* (2013.01); *H02M 2001/0009* (2013.01); *H02M 2001/0025* (2013.01)

(58) Field of Classification Search
CPC ... H02M 3/335; H02M 3/33507; H02M 3/156
USPC ....... 327/108–112; 363/15, 20, 21.01, 21.18, 363/21.04, 21.05, 21.1, 21.11–21.13
See application file for complete search history.

(56) References Cited

U.S. PATENT DOCUMENTS

| | | | |
|---|---|---|---|
| 6,107,851 | A  | 8/2000 | Balakrishnan et al. |
| 6,249,876 | B1 | 6/2001 | Balakrishnan et al. |
| 8,368,370 | B2 | 2/2013 | Morrish |
| 9,246,392 | B2 | 1/2016 | Balakrishnan et al. |

(Continued)

OTHER PUBLICATIONS

European Patent Application No. 17190018.6—Extended European Search Report dated Feb. 23, 2018, 9 pages.

*Primary Examiner* — Lincoln D Donovan
*Assistant Examiner* — Diana J. Cheng
(74) *Attorney, Agent, or Firm* — Christensen O'Connor Johnson Kindness PLLC (57) ABSTRACT

A controller for use in a power converter includes a drive circuit coupled to generate a drive signal to control switching of a power switch to control a transfer of energy from a power converter input to a power converter output. An input is also included to receive an enable signal including enable events responsive to the power converter output. The drive circuit is coupled to turn ON the power switch in response to the enable events, and turn OFF the power switch in response to a power switch current reaching a current limit threshold. A current limit threshold generator is coupled to receive the drive signal from the drive circuit to vary the current limit threshold at a variable rate in response to the enable events of the enable signal.

20 Claims, 4 Drawing Sheets

(56) References Cited

U.S. PATENT DOCUMENTS

| | | |
|---|---|---|
| 9,450,478 B1 | 9/2016 | Djenguerian et al. |
| 9,774,248 B2 | 9/2017 | Saint-Pierre et al. |
| 2011/0175584 A1 | 7/2011 | Huber et al. |
| 2013/0301311 A1 | 11/2013 | Wang et al. |
| 2017/0085185 A1 | 3/2017 | Wang |
| 2018/0074531 A1 | 3/2018 | Pham et al. |

SWITCHED MODE POWER CONVERTER CONTROLLER WITH RAMP TIME MODULATION WITH JITTER FREQUENCY

REFERENCE TO RELATED APPLICATION

This application claims the benefit of U.S. Provisional Application No. 62/395,874, filed on Sep. 16, 2016.

BACKGROUND INFORMATION

Field of the Disclosure

The present invention relates generally to power converters, and more specifically to controllers for switched mode power converters.

Background

Electronic devices use power to operate. Switched mode power converters are commonly used due to their high efficiency, small size and low weight to power many of today's electronics. Conventional wall sockets provide a high voltage alternating current. In a switching power converter a high voltage alternating current (ac) input is converted to provide a well regulated direct current (dc) output through an energy transfer element. In operation, a switch is utilized to provide the desired output by varying the duty cycle (typically the ratio of the ON time of the switch to the total switching period), varying the switching frequency or varying the number of pulses per unit time of the switch in a switched mode power converter.

The switched mode power converter also includes a controller. Output regulation may be achieved by sensing and controlling the output in a closed loop. The controller may receive a signal representative of the output and the controller varies one or more parameters in response to the signal to regulate the output to a desired quantity. Various modes of control may be utilized such as pulse width modulation (PWM) control or ON/OFF control.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Various modes of control may be utilized to regulate the output of a power converter. In PWM peak current mode control, the switch remains ON until the current in the switch reaches a regulation threshold. Once the regulation threshold is reached, the controller turns the switch off for the remainder of the switching period. In general, the controller regulates the output of the power converter by altering the duty ratio of the switch. The controller may alter the duty ratio by altering the magnitude of the regulation threshold. A greater regulation threshold corresponds to a longer ON time and a larger duty ratio for the switch. However, it should be appreciated that the regulation threshold is generally fixed for an individual switching cycle. For PWM peak current mode control, the controller generally receives an analog signal representative of the output of the power converter. In one example, the signal received by the controller may convey how far away the sensed output of the power converter is from the desired quantity. The controller then alters the duty ratio of the switch based on the received analog signal.

Another mode of control is known as ON/OFF control, which enables or disables a switching cycle. When a cycle is enabled, the switch may conduct current while the switch cannot conduct current during a disabled cycle. The controller produces a sequence of enabled and disabled switching cycles to regulate the output of the power converter. For ON/OFF control, the controller generally receives a logic signal representative of the output of the power converter. In one example, the signal received by the controller may be a series of logic-level pulses, which would enable or disable the switch. In another example, the signal received by the controller may be a digital signal used for enabling or disabling the switch.

In one type of ON/OFF control, the controller turns ON the switch for a fixed ON time during an enabled cycle. In another type of ON/OFF control, referred to as current limited ON/OFF control, the controller turns ON the switch during an enabled cycle and turns OFF the switch once the current in the switch reaches a current limit threshold. In general, utilizing an enable signal in the form of a logic state to represent the output of the power converter may be beneficial, as the enable signal may be more noise immune than an analog signal representative of the output. However, due to the enabling and disabling of cycles, the effective switching frequency of the power converter may fall into the audible noise range. In addition, the root-mean-squared (RMS) current may be higher for power converters using ON/OFF control and as such the power converter may be less efficient.

As will be discussed, examples in accordance with the teachings of the present invention provide a current limited ON/OFF control scheme with a variable current limit threshold. With discussed examples, the controller receives an enable signal representative of the output of the power converter. The enable signal includes a series of events, which enable or disable the power switch. In one example, the controller turns on the power switch in response to an event of the enable signal and turns off the power switch when the current in the power switch reaches the variable current limit threshold. The variable current limit threshold varies in response to the time between successive events of the enable signal.

Further, the variable current limit threshold may vary in response to the time between events of the enable signal over a range of loads coupled to the output of the power converter. In one example, the variable current limit threshold may be a ramp signal and the ramp signal along with the time between events of the enable signal may be used to modulate the drive signal which controls the switching of the power switch to regulate the output of the power converter.

In one example, the variable current limit threshold increases at an increase rate at the end of each ON time of the power switch for a fixed time period or until the maximum current limit threshold is reached. In another example, the variable current limit increases with a fixed increase amount in response to the end of the ON time of the power switch. The variable current limit threshold then decreases at a decrease rate until the current in the power switch reaches the current limit threshold or the variable current limit threshold reaches the minimum current limit threshold. In one example, the current limit threshold is increases at a variable rate and decreases at a fixed rate. As such, examples in accordance with the teachings of the present invention may have increased efficiency and may reduce the likelihood of producing audible noise while preserving the benefits of a logic or digital enable signal representative of the output of the power converter.

Furthermore, according to one aspect of this invention a frequency jitter is added to the variable current which helps lower the audible noise.

Figure 1:
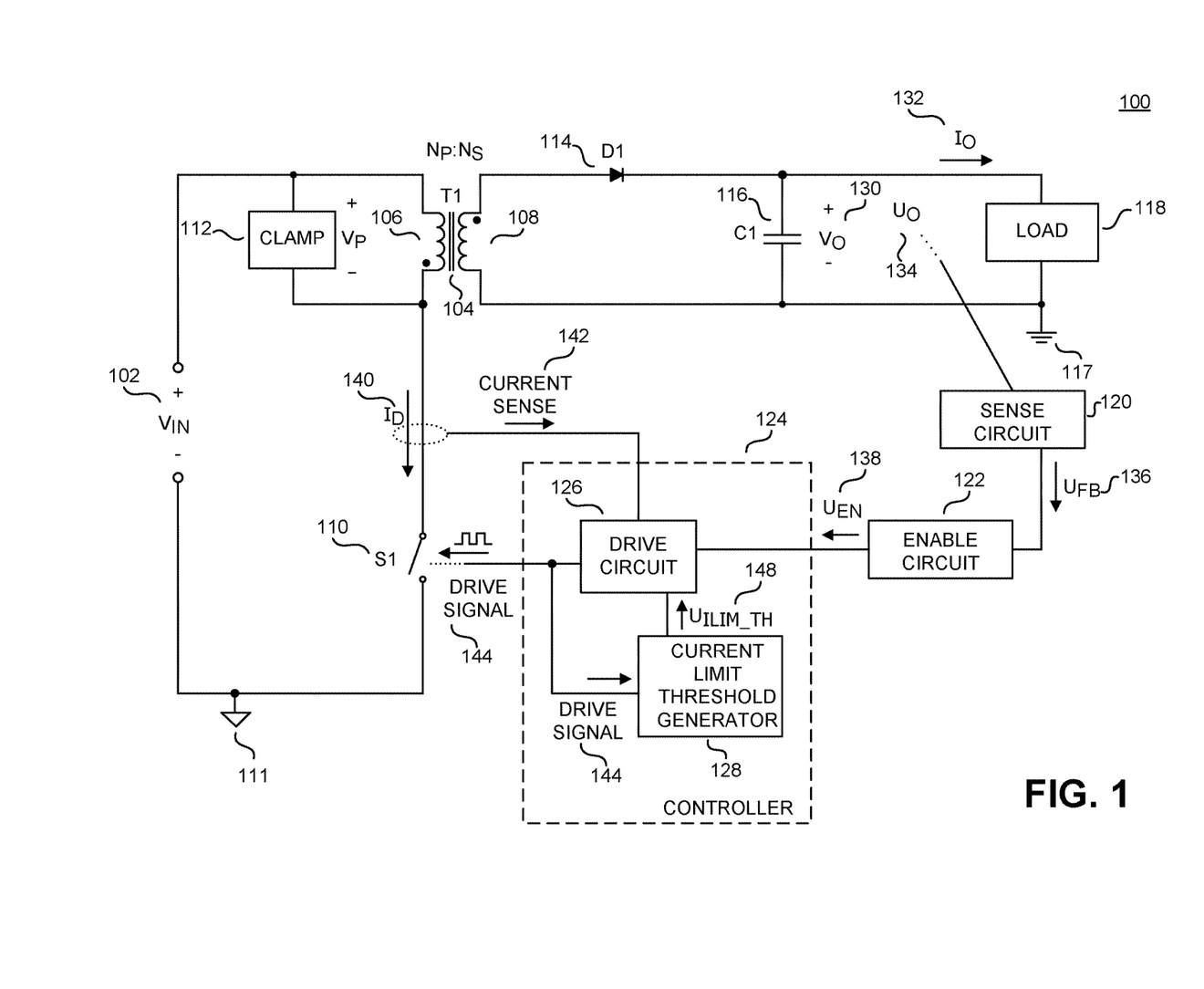
FIG. 1 is a diagram illustrating an example switched mode power converter utilizing a controller, in accordance with the teachings of the present invention.

To illustrate, FIG. 1 shows an example power converter 100 including input $V_{IN}$ 102, an energy transfer element T1 104, a primary winding 106 of the energy transfer element T1 104, a secondary winding 108 of the energy transfer element T1 104, a switch S1 110, input return 111, a clamp circuit 112, a rectifier D1 114, an output capacitor C1 116, an output return 117, a load 118, a sense circuit 120, an enable circuit 122, and a controller 124. Controller 124 further includes a drive circuit block 126 and a current limit threshold generator 128. In one example, enable circuit 122 and sense circuit 120 may also be included in controller 124. FIG. 1 further illustrates an output voltage $V_O$ 130, an output current $I_O$ 132, an output quantity $U_O$ 134, a feedback signal $U_{FB}$ 136, an enable signal $U_{EN}$ 138, a switch current $I_D$ 140, a current sense signal 142, a drive signal 144, and a current limit threshold signal $U_{ILIM\_TH}$ 148. The example switched mode power converter 100 illustrated in FIG. 1 is coupled in a flyback configuration, which is just one example of a switched mode power converter that may benefit from the teachings of the present invention. It is appreciated that other known topologies and configurations of switched mode power converter may also benefit from the teachings of the present invention.

In the illustrated example, the power converter 100 provides output power to a load 118 from an unregulated input $V_{IN}$ 102. In one example, the input $V_{IN}$ 102 is a rectified and filtered ac line voltage. In another example, the input voltage $V_{IN}$ 102 is a dc input voltage. The input $V_{IN}$ 102 is coupled to the energy transfer element T1 104. In some examples, the energy transfer element T1 104 may be a coupled inductor. In other examples, the energy transfer element T1 104 may be transformer. In the example of FIG. 1, the energy transfer element T1 104 includes two windings, a primary winding 106 and secondary winding 108. $N_P$ and $N_S$ are the number of turns for the primary winding 106 and secondary winding 108, respectively. In the example of FIG. 1, primary winding 106 may be considered an input winding, and secondary winding 108 may be considered an output winding. The primary winding 106 is further coupled to power switch S1 110, which is then further coupled to the input return 111. In addition, the clamp circuit 112 is coupled across the primary winding 106 of the energy transfer element T1 104.

The secondary winding 108 of the energy transfer element T1 104 is coupled to the rectifier D1 114. In the example illustrated in FIG. 1, the rectifier D1 114 is exemplified as a diode and the secondary winding 108 is coupled to the anode of the diode. In some examples, the rectifier D1 114 may be a transistor used as a synchronous rectifier. When a transistor is utilized as a synchronous rectifier, another controller (referred to as a secondary controller) may be utilized to control the turning ON and OFF of the transistor. In examples, the enable circuit 122 and/or sense circuit 120 may be included in the secondary controller (not shown). As shown in the depicted example, the output capacitor C1 116 and the load 118 are coupled to the rectifier D1 114. In the example of FIG. 1, both the output capacitor C1 116 and the load 118 are coupled to the cathode of the diode. An output is provided to the load 118 and may be provided as either an output voltage $V_O$ 130, output current $I_O$ 132, or a combination of the two.

The power converter 100 further includes circuitry to regulate the output, which is exemplified as output quantity $U_O$ 134. A sense circuit 120 is coupled to sense the output quantity $U_O$ 134 and to provide feedback signal $U_{FB}$ 136, which is representative of the output quantity $U_O$ 134. Feedback signal $U_{FB}$ 136 may be voltage signal or a current signal. In one example, the sense circuit 120 may sense the output quantity from an additional winding included in the energy transfer element T1 104. In another example, there may be a galvanic isolation (not shown) between the controller 124 and the enable circuit 122 or between the enable circuit 122 and the sense circuit 120. The galvanic isolation could be implemented by using devices such as an opto-coupler, a capacitor or a magnetic coupling. In a further example, the sense circuit 120 may utilize a voltage divider to sense the output quantity $U_O$ 134 from the output of the power converter 100. In general, the output quantity $U_O$ 134 is either an output voltage $V_O$ 130, output current $I_O$ 132, or a combination of the two.

As shown in the depicted example, enable circuit 122 is coupled to sense circuit 120 and receives feedback signal $U_{FB}$ 136 representative of the output of power converter 100 from the sense circuit 120. Enable signal $U_{EN}$ 138 may be a voltage signal or a current signal. In one example, enable signal $U_{EN}$ 138 is also representative of the output of the power converter 100 and provides information to the controller 124 to enable or disable the power switch S1 110. Further, the enable signal $U_{EN}$ 138 may include one or more enable events, which cause the power switch S1 110 to be enabled (or disabled). For example, the power switch S1 110 may be enabled when an enable event in enable signal $U_{EN}$ 138 is received. In one example, the enable circuit 122 outputs enable signal $U_{EN}$ 138, which in one example is a rectangular pulse waveform with varying lengths of logic high and logic low sections. In another example, the enable signal $U_{EN}$ 138 may be a logic or digital signal. An enable event in enable signal $U_{EN}$ 138 may be a pulse or a series of pulses that enable (or disable) the power switch S1 110. In another example, an enable event in enable signal $U_{EN}$ 138 may be a transition from one logic state to another logic state, which enables (or disables) the power switch S1 110. In a further example, enable signal $U_{EN}$ 138 may be an analog signal, and an enable event may be indicated with enable signal $U_{EN}$ 138 crossing of a threshold value.

Controller 124 is coupled to the enable circuit 122 and receives enable signal $U_{EN}$ 138 from the enable circuit 122. The controller 124 further includes terminals for receiving the current sense signal 142 and for providing the drive signal 144 to power switch S1 110. The current sense signal 142 may be representative of the switch current $I_D$ 140 in power switch S1 110. Current sense signal 142 may be a voltage signal or a current signal. In addition, the controller 124 provides drive signal 144 to the power switch S1 110 to control various switching parameters to control the transfer of energy from the input of power converter 100 to the output of power converter 100. Examples of such parameters may include switching frequency, switching period, duty cycle, or respective ON and OFF times of the power switch S1 110.

As illustrated in example depicted in FIG. 1, the controller 124 includes drive circuit 126 and current limit threshold generator 128. The drive circuit 126 is coupled to receive the enable signal $U_{EN}$ 138. In one example, drive circuit 126 outputs drive signal 144 in response to the enable signal $U_{EN}$ 138. In some examples, drive circuit 126 further receives current sense signal 142 and outputs drive signal 144 in further response to the current sense signal 142. Current limit threshold generator 128 is coupled to receive the drive signal 144 from the drive circuit 126 and further outputs the current limit threshold signal $U_{ILIM\_TH}$ 148 to the drive circuit 126. In one example, current limit threshold generator 128 is coupled to vary the current limit threshold signal $U_{ILIM\_TH}$ 148 in response to a time between the enable events of the enable signal $U_{EN}$ 138. In one example, the current limit threshold signal $U_{ILIM\_TH}$ 148 may be a ramp signal and the ramp signal along with the time between enable events may be used to modulate the drive signal 144 to regulate the output of the power converter.

For instance, in one example, the current limit threshold generator 128 is coupled to increase, within a current limit threshold range, the current limit threshold signal $U_{ILIM\_TH}$ 148 at a increase rate during a fixed time period after an end of each ON time of the power switch S1 110. In the example, after the fixed time period after the end of each ON time of the power switch S1 110, the current limit threshold generator 128 is coupled to decrease the current limit threshold signal $U_{ILIM\_TH}$ 148, within the current limit threshold range, at a decrease rate until the current through power switch S1 110 reaches the current limit threshold. In one example, the current limit threshold signal $U_{ILIM\_TH}$ 148 may be a voltage signal or a current signal. As illustrated, the drive circuit 126 also outputs drive signal 144 in response to the current limit threshold signal $U_{ILIM\_TH}$ 148.

In the example of FIG. 1, input voltage $V_{IN}$ 102 is positive with respect to input return 111, and output voltage $V_O$ 130 is positive with respect to output return 117. In the example illustrated in FIG. 1, the input return 111 is galvanically isolated from the output return 117. In other words, a dc voltage applied between input return 111 and output return 117 will produce substantially zero current. Therefore, circuits electrically coupled to the primary winding 106 are galvanically isolated from circuits electrically coupled to the secondary winding 108. For example, galvanic isolation could be implemented by using an opto-coupler, a capacitive coupler or a magnetic coupler between the controller 124 and the enable circuit 122 or between the enable circuit 122 and the sense circuit 120.

In one example, the power converter 100 of FIG. 1 provides regulated output power to the load 118 from an unregulated input $V_{IN}$ 102. The power converter 100 utilizes the energy transfer element T1 104 to transfer energy between the primary 106 and secondary 108 windings. The clamp circuit 112 is coupled to the primary winding 106 of the energy transfer element T1 104 to limit the maximum voltage on the power switch S1 110. In the example power converter 100 shown in FIG. 1, the clamp circuit 112 limits the voltage spike caused by the leakage inductance of the primary winding 106 after the power switch S1 110 has turned OFF. Power switch S1 110 is opened and closed in response to the drive signal 144 received from the controller 124 to control the transfer of energy from the input of the power converter 100 to the output of power converter 100. It is generally understood that a switch that is closed may conduct current and is considered on, while a switch that is open cannot conduct current and is considered off. In the example of FIG. 1, power switch S1 110 controls a current $I_D$ 140 in response to controller 124 to meet a specified performance of the power converter 100. In some examples, the power switch S1 110 may be a transistor and the controller 124 may include integrated circuits and/or discrete electrical components. In one example, controller 124 and power switch S1 110 are included together in a single integrated circuit. In one example, the integrated circuit is a monolithic integrated circuit. In another example, the integrated circuit is a hybrid integrated circuit.

The operation of power switch S1 110 also produces a time varying voltage $V_P$ across the primary winding 106. By transformer action, a scaled replica of the voltage $V_P$ is produced across the secondary winding 108, the scale factor being the ratio that is the number of turns $N_S$ of secondary winding 108 divided by the number of turns $N_P$ of primary winding 106. The switching of power switch S1 110 also produces a pulsating current at the rectifier D1 114. The current in rectifier D1 114 is filtered by output capacitor C1 116 to produce a substantially constant output voltage $V_O$ 130, output current $I_O$ 132, or a combination of the two at the load 118.

In the illustrated example, sense circuit 120 senses the output quantity $U_O$ 134 to provide the feedback signal $U_{FB}$ 136 representative of the output of power converter 100 to the enable circuit 122. The enable circuit 122 receives the feedback signal $U_{FB}$ 136 and produces an enable signal $U_{EN}$ 138. The enable signal $U_{EN}$ 138 is representative of the output of the power converter 100 and provides information to the controller 124 (using enable events) to enable or disable the power switch S1 110. Further, the time between enable events of the enable signal $U_{EN}$ 138 is responsive to the power converter output. In examples, an enable event may be generated when the output quantity $U_O$ 134 or feedback signal $U_{FB}$ 136 falls below a threshold. In one example, the enable signal $U_{EN}$ 138 may utilize a pulse (the enable signal increases to a logic high value and decreases to a logic low value) as the enable event to control the power switch S1 110.

In the example of FIG. 1, the controller 124 receives the enable signal $U_{EN}$ 138 and also receives the current sense signal 142, which is representative of the sensed switch current $I_D$ 140 in the power switch S1 110. The switch current $I_D$ 140 may be sensed in a variety of ways, such as for example, the voltage across a discrete resistor or the voltage across the transistor when the transistor is conducting. The controller 124 outputs drive signal 144 to operate the power switch S1 110 in response to various inputs to substantially regulate the output quantity $U_O$ 134 to the desired value. With the use of the sense circuit 120, enable circuit 122, and the controller 124, the output of the power converter 100 is regulated in a closed loop in accordance with the teachings of the present invention.

As shown in the depicted example, controller 124 further includes drive circuit 126, which receives the enable signal $U_{EN}$ 138 and current sense signal 142. Drive circuit 126 outputs the drive signal 144 to control switching the power switch S1 110 in response to the enable signal $U_{EN}$ 138 and current sense signal 142 to control the transfer of energy from the input of power converter 100 to the output of power converter 100. In one example, drive circuit 126 turns ON the power switch S1 110 in response to an enable event. In one example, drive circuit 126 turns ON the power switch S1 110 when the enable signal $U_{EN}$ 138 pulses to a logic high value. In one example, drive circuit 126 turns OFF the power switch S1 110 when the switch current $I_D$ 140 represented with the current sense signal 142 reaches the current limit threshold signal $U_{ILIM\_TH}$ 148. In one example, the drive signal 144 is a rectangular pulse waveform with varying lengths of logic high and logic low sections. Drive signal 144 may be a voltage signal or a current signal. In one example, the power switch S1 110 is ON when the drive signal 144 is logic high and the power switch S1 110 is OFF when the drive signal 144 is logic low.

As shown in the depicted example, the drive signal 144 is also coupled to be received by the current limit threshold generator 128. In one example, the current limit threshold generator 128 generates the current limit threshold signal $U_{ILIM\_TH}$ 148 in response to the drive signal 144. As will be further discussed, the current limit threshold signal $U_{ILIM\_TH}$ 148 increases, within a current limit threshold range, at a variable increase rate for a fixed time period after the end of the ON time of the power switch S1 110. In other words, the current limit threshold signal $U_{ILIM\_TH}$ 148 increases at the variable rate by a fixed amount, within the current limit threshold range, at the end of the ON time of the power switch S1 110. Thus, in one example the current limit threshold signal $U_{ILIM\_TH}$ 148 does not increase beyond a maximum current limit threshold. After the fixed time period, the current limit threshold signal $U_{ILIM\_TH}$ 148 decreases, within the current limit threshold range, at a fixed decrease rate. In one example, the current limit threshold signal $U_{ILIM\_TH}$ 148 decreases until the switch current $I_D$ 140 indicated by the current sense signal 142 reaches the current limit threshold signal $U_{ILIM\_TH}$ 148 or until the current limit threshold signal $U_{ILIM\_TH}$ 148 reaches a minimum current limit threshold.

As mentioned above, the drive signal 144 is generated in response to the enable signal $U_{EN}$ 138. In one example, current limit threshold generator 128 therefore also generates the current limit threshold signal $U_{ILIM\_TH}$ 148 in response to the enable signal $U_{EN}$ 138. In particular, the current limit threshold signal $U_{ILIM\_TH}$ 148 is responsive to the time between enable events of the enable signal $U_{EN}$ 138 over a range of loads coupled to the output of the power converter 100. In another example, the current limit threshold signal $U_{ILIM\_TH}$ 148 may be a ramp signal and the ramp signal along with the time between enable events may be used to modulate the drive signal 144 to regulate the output of the power converter. As such, examples in accordance with the teachings of the present invention may have increased efficiency and may reduce the likelihood of producing audible noise while preserving the benefits of a logic or digital enable signal representative of the output of the power converter 100.

Figure 2:
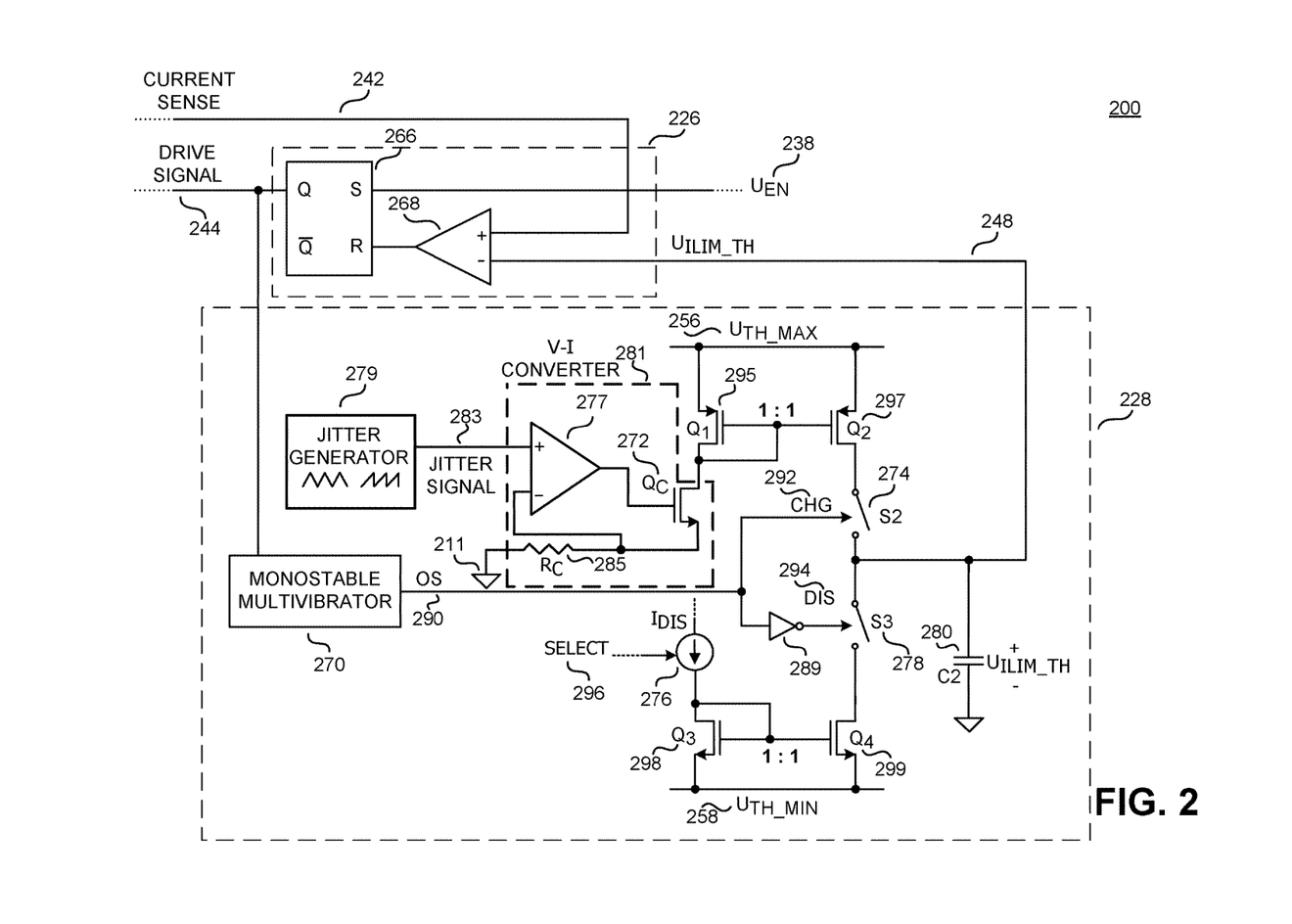
FIG. 2 is a diagram illustrating an example of the controller of FIG. 1, in accordance with the teachings of the present invention.

FIG. 2 illustrates an example controller 200, which in one example may be controller 100 of FIG. 1. It should be appreciated that similarly named and numbered elements referenced below are coupled and function as described above. As mentioned above, drive circuit 226 is coupled to receive the enable signal $U_{EN}$ 238, current sense signal 242 and the current limit threshold signal $U_{ILIM\_TH}$ 248. In the illustrated example, drive circuit 226 is shown including latch 266, which in the illustrated example is coupled to be reset by comparator 268. In the example, latch 266 is coupled to receive the enable signal $U_{EN}$ 238 at its S-input while the output of comparator is coupled to the R-input of latch 266. The drive signal 244 is output from the latch 266. As shown, the drive signal 244 is output from the Q-output of latch 266. As will be further discussed, the Q-output of the latch 266 is logic high if the enable signal $U_{EN}$ 238 is logic high. In one example, the enable signal $U_{EN}$ 238 is a rectangular pulse waveform, which transitions to a logic high value and quickly falls to a logic low value. In one example, the occurrence of a logic high pulse of the enable signal $U_{EN}$ 238 may be referred to as an enable event. When an enable event is received at the S-input of latch 266, the drive signal 244 transitions to a logic high value. Drive signal 244 transitions to a logic low value when a logic high value is received at the R-input of latch 266.

As shown in the depicted example, comparator 268 is coupled to receive the current sense signal 242 and the current limit threshold signal $U_{ILIM\_TH}$ 248. In the example shown in FIG. 2, the current sense signal 242 is received at the non-inverting input of comparator 268 while the current limit threshold signal $U_{ILIM\_TH}$ 248 is received at the inverting input of comparator 268. Drive signal 244 transitions to a logic low value when the current sense signal 242 reaches the current limit threshold signal $U_{ILIM\_TH}$ 248. As mentioned above, in one example the current sense signal 242 is representative of the switch current $I_D$ 140. As such, the drive signal 244 transitions to a logic low value when the switch current $I_D$ 140 represented with current sense signal 242 reaches the current limit threshold signal $U_{ILIM\_TH}$ 248. In one example, the drive signal 244 is a rectangular pulse waveform with varying lengths of logic high and logic low sections. In one example, the length of time that the drive signal 244 is logic high corresponds to the ON time ($t_{ON}$) of the power switch S1 110 and the length of time the drive signal 244 is logic low corresponds to the OFF time ($t_{OFF}$) of the power switch S1 110. In addition, the length of time between rising edges of the drive signal 244 may be referred to as the switching period $T_S$.

Current limit threshold generator 228 is coupled to receive the drive signal 244 from the drive circuit 226. In the example depicted in FIG. 2, a monostable multivibrator 270 is coupled to receive the drive signal 244 from latch 266. In one example, the monostable multivibrator 270 generates a pulse with a fixed time period (in other words, the pulse is logic high for a fixed time period) in response to an edge of the drive signal 244. In one example, the monostable multivibrator 270 generates a pulse with a fixed time period in response to the falling edge of the drive signal 244. In other words, the monostable multivibrator 270 generates a pulse with a fixed time period at the end of the ON time ($t_{ON}$) of the power switch. The output of the monostable multivibrator 270 is referred to as the one shot signal OS 290.

One end of switch S2 274 is coupled to transistor Q2 297, while the other end of switch S2 274 is coupled to one end of switch S3 278. The other end of switch S3 278 is coupled to transistor Q4 299. One end of capacitor C2 280 is coupled to a node between switch S2 274 and switch S3 278. As illustrated, the voltage across capacitor C2 280 is output from the current limit threshold generator 228 as current limit threshold signal $U_{ILIM\_TH}$ 248.

Also shown in FIG. 2 is a voltage to current (V-I) converter 281 and a jitter generator 279. In one example the jitter generator is a waveform generator the output of which can be a triangular voltage waveform or a sawtooth waveform. In other examples, the jitter generator 279 could output any waveform. As will explained later in the description, in one example, the rate at which the current limit threshold signal is varied is proportional (slope of the plotted waveform of the current limit threshold signal) to the slope of the waveform output by the jitter generator.

In one example, the V-I converter 281 includes an op-amp 277, a transistor $Q_C$ 272, and a resistor $R_C$ 285. In one example, the V-I converter 281 may be considered as a variable current source.

A control terminal of the transistor $Q_C$ 272 is coupled to receive the output of the op-amp 277. As shown in FIG. 2, the transistor $Q_C$ 272 is coupled as a current source, and therefore the term current source or transistor may be used interchangeably when referring to $Q_C$ 272 of V-I converter 281. In one example the op-amp 277 is coupled as an error amplifier. A non-inverting input terminal of the op-amp 277 is coupled receive a jitter signal 283 from a jitter generator 279. An inverting input terminal of the op-amp 277 and the transistor $Q_C$ 272 are coupled to one end of the resistor $R_C$ 285. The other end of resistor $R_C$ 285 is coupled to the input return 211.

The jitter signal 283 may be a voltage signal. As the voltage level of the jitter signal changes, the voltage at the inverting input terminal of the op-amp 277 also varies, which may vary the current through the transistor $Q_C$ 272.

One end of the transistor Q1 295 of the current mirror is coupled to receive an output of the V-I converter 281.

Figure 3:
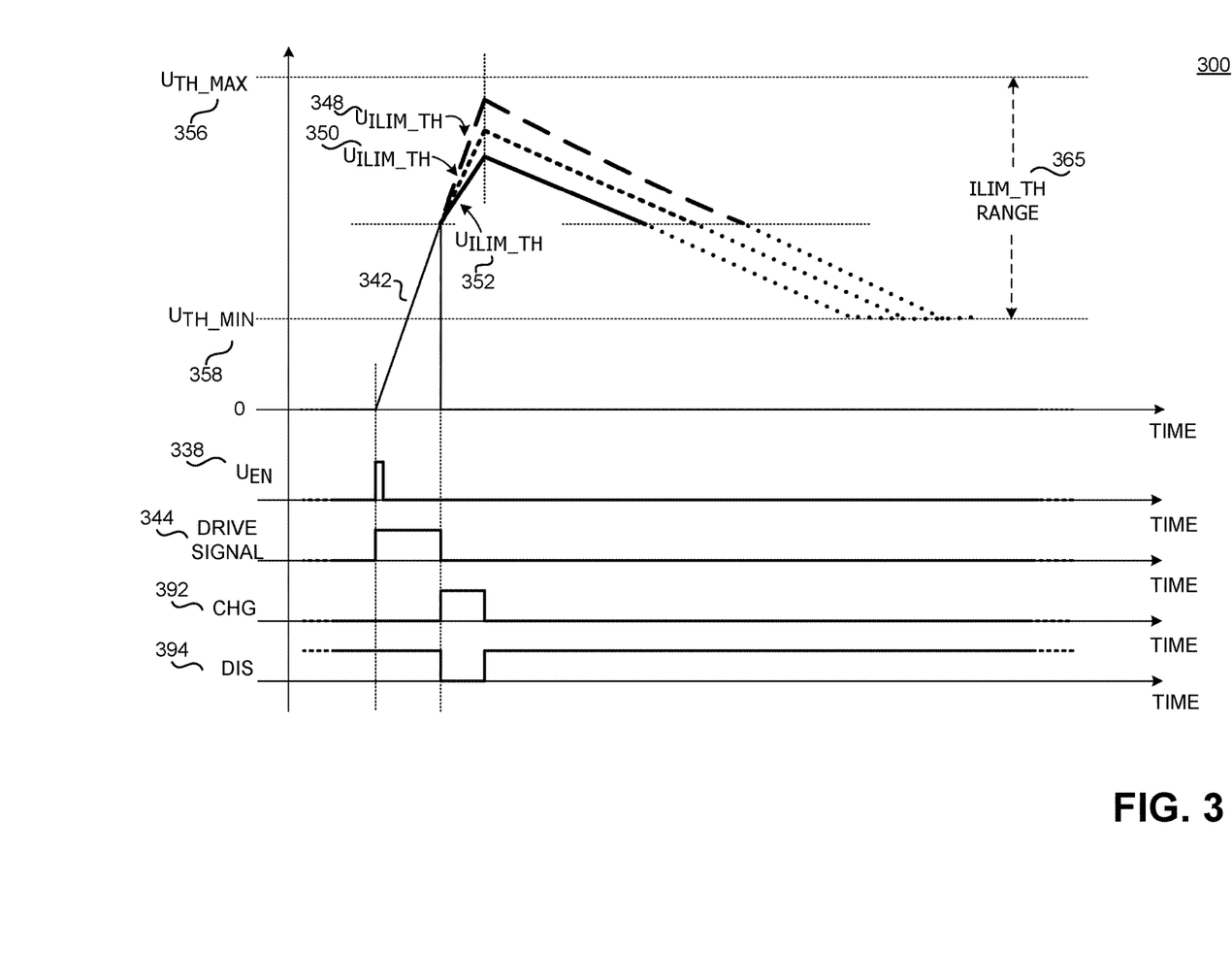
FIG. 3 is a timing diagram illustrating various example waveforms representing signals of the example controller of FIG. 2, in accordance with the teachings of the present invention.

As illustrated in FIG. 2, current source 276 may be coupled to receive select signal SELECT 296. In one example, the current source 276 is a fixed current source. Select signal SELECT 296 may be utilized to select the magnitude of $I_{DIS}$ of current source 276. As will be further discussed, the magnitude of $I_{DIS}$ of current source 276 affects the discharge rate of the capacitor C2 280. As such, the select signal SELECT 296 may select the magnitude of $I_{DIS}$ of current source 276 in response to the input voltage $V_{IN}$ 102 of the power converter in accordance with the teachings of the present invention. For instance, in one example, select signal SELECT 296 may set a first magnitude for $I_{DIS}$ for a first input voltage value for $V_{IN}$ 102 and select signal SELECT 296 may set a second magnitude for $I_{DIS}$ for a second input voltage value for $V_{IN}$ 102 in accordance with the teachings of the present invention. In other words, in one example, a plurality of different $I_{DIS}$ magnitudes for current source 276 may be selected in response to the input voltage $V_{IN}$, as represented in FIG. 3, in accordance with the teachings of the present invention. In one example, a lower input voltage $V_{IN}$ 102 may correspond to a larger magnitude for $I_{DIS}$. In another example, a first magnitude of $I_{DIS}$ for the current source 276 may be selected for a first range of $V_{IN}$ 102 and a second magnitude of $I_{DIS}$ for the current source 276 may be selected for second range of $V_{IN}$ 102. In one example, there could be several ranges of $V_{IN}$ 102 and corresponding magnitudes of $I_{DIS}$ for the current source 276. The ranges of $V_{IN}$ 102 in one example, could correspond to ac voltage ranges needed to operate in different geographies; 100 VAC−15% to 115 VAC+15% for Japan and the U.S., 230 VAC+/−15% for Europe, etc.

When the one shot signal OS 290 transitions to a logic high value, the charging signal CHG 292 transitions to a logic high value and switch S2 274 is closed. In addition, the discharge signal DIS 294 transitions to a logic low value and opens switch S3 278. As such, the capacitor C2 280 is charged by current source $Q_C$ 272 with current $I_C$. In one example, the amount at which the voltage (i.e., the current limit threshold signal $U_{ILIM\_TH}$ 248) across capacitor C2 280 increases at a variable rate that is proportional to the magnitude of a current $I_C$ (not shown) provided by variable current source $Q_C$ 272 and the amount of time the one shot signal OS 290 is logic high (i.e., the fixed time period). In particular, the amount which the current limit threshold signal $U_{ILIM\_TH}$ 248 increases is substantially equal to the product of the magnitude of current $I_C$ and the fixed time period divided by the capacitance of capacitor C2 280. Or mathematically: $\Delta U_{ILIM\_TH} \cong I_C t_{FIXED}/C$. Or in other words, the increase rate of the current limit threshold signal $U_{ILIM\_TH}$ 248 is proportional to the magnitude of current $I_C$ and the capacitance of capacitor C2 280.

Charging signal CHG 292 transitions to logic low if the one shot signal OS 290 transitions to a logic low value or the voltage across capacitor C2 280 (i.e., current limit threshold signal $U_{ILIM\_TH}$ 248) reaches the maximum current limit threshold $U_{TH\_MAX}$ 256. When the charging signal CHG 292 is a logic low value, the switch S2 274 opens, and capacitor C2 280 is no longer charged by current source $Q_C$ 272.

When the inverted one shot signal output from inverter 289 transitions to the logic high value, the discharging signal DIS 294 transitions to a logic high value and closes switch S3 278. As such, the capacitor C2 280 is discharged by the current source 276 with current $I_{DIS}$. In one example, the decrease rate of the current limit threshold signal $U_{ILIM\_TH}$ 248 is a fixed rate and is proportional to the magnitude of current $I_{DIS}$ and the capacitance of capacitor C2 280. In one example, the magnitude of the increase rate is greater than the magnitude of the decrease rate.

Discharging signal DIS 294 transitions to logic low if the inverted one shot signal output from inverter 289 transitions to a logic low value, or if the voltage across capacitor C2 280 (i.e., current limit threshold signal $U_{ILIM\_TH}$ 248) reaches the minimum current limit threshold $U_{TH\_MIN}$ 258. When the discharging signal DIS 294 is a logic low value, the switch S3 278 opens and capacitor C2 280 is no longer discharged by current source 276.

FIG. 3 is a timing diagram illustrating various example waveforms of signals shown in FIG. 2 in accordance with the teachings of the present invention. In particular, the timing diagram 300 illustrates an example in which there are three current limit threshold signals namely $U_{ILIM\_TH}$ 348, $U_{ILIM\_TH}$ 350, and $U_{ILIM\_TH}$ 352. As shown in the depicted example, the current limit threshold signals $U_{ILIM\_TH}$ 348, $U_{ILIM\_TH}$ 350, and $U_{ILIM\_TH}$ 352 increase at a variable rate, and decrease at a fixed rate in accordance with the teachings of the present invention.

An enable event is received (as shown by the pulse of enable signal $U_{EN}$ 338) and the drive signal 344 transitions to a logic high value and the power switch S1 110 is turned ON. When the switch current $I_D$ 140 represented with current sense signal 342 reaches the current limit threshold signal $U_{ILIM\_TH}$ 348, the drive signal 344 transitions to a logic low value and the power switch S1 110 is turned OFF. At the end of the ON time, the charge signal CHG 392 transitions to a logic high value and the discharge signal DIS 394 transitions to a logic low value. The switch S2 274 is closed and the current limit threshold signal $U_{ILIM\_TH}$ 348 increases. As mentioned above, the length of time which the charge signal CHG 392 is logic high may be referred to as the fixed time period.

However, as the current limit threshold signal $U_{ILIM\_TH}$ 348 approaches the maximum current limit threshold $U_{TH\_MAX}$ 256 before the end of the fixed time period, the current mirror formed by transistors Q1 295 and Q2 297 is no longer able to mirror the current $I_C$ provided by the transistor $Q_C$ 272 and will provide less current to charge the capacitor C2 280. As such the increase rate of the current limit threshold signal $U_{ILIM\_TH}$ 348 decreases as shown by the curved characteristic of the current limit threshold signal $U_{ILIM\_TH}$ 348 closer to the maximum current limit threshold $U_{TH\_MAX}$ 356. The shape of the curved characteristic may be partially determined by the ratio between the channel width and channel length of transistors Q1 295 and Q2 297. Once the current limit threshold signal $U_{ILIM\_TH}$ 348 reaches the maximum current limit threshold $U_{TH\_MAX}$ 356, the current mirror formed by transistors Q1 295 and Q2 297 provide substantially no current and the current limit threshold signal $U_{ILIM\_TH}$ 348 is substantially clamped at the maximum current limit threshold $U_{TH\_MAX}$ 356.

At the end of the fixed on time, the discharge signal DIS 394 transitions to a logic high value and switch S3 278 is closed and the current limit threshold signal $U_{ILIM\_TH}$ 348 begins to decrease within the current limit threshold range ILIM_TH RANGE 365. However, as the current limit threshold signal $U_{ILIM\_TH}$ 348 approaches the minimum current limit threshold $U_{TH\_MIN}$ 358, the current mirror formed by transistors Q3 298 and Q4 299 is no longer able to mirror the current $I_{DIS}$ provided by current source 276 and will provide less current to discharge the capacitor C2 280. As such, the magnitude of the decrease rate of the current limit threshold signal $U_{ILIM\_TH}$ 348 decreases as shown by the curved characteristic of the current limit threshold signal $U_{ILIM\_TH}$ 348 closer to the minimum current limit threshold $U_{TH\_MIN}$ 358. The shape of the curved characteristic may be partially determined by the ratio between the channel width and channel length of transistors Q3 298 and Q4 299. Once the current limit threshold signal $U_{ILIM\_TH}$ 348 reaches the minimum current limit threshold $U_{TH\_MIN}$ 358, the current mirror formed by transistors Q3 298 and Q4 299 provide substantially no current and the current limit threshold signal $U_{ILIM\_TH}$ 348 is substantially clamped at the minimum current limit threshold $U_{TH\_MIN}$ 358.

In accordance with the teachings of the present invention, the slope of the current limit threshold signal may be varied by adding or introducing the jitter signal 283. The addition of jitter may result in current limit threshold signal $U_{ILIM\_TH}$ 350 or $U_{ILIM\_TH}$ 352 as shown in FIG. 3. In other words, the addition of jitter signal varies the rate at which the capacitor C2 280 is charged. In one example the discharge rate of the capacitor C2 280 is substantially the same for any of the current limit threshold plots.

Figure 4:
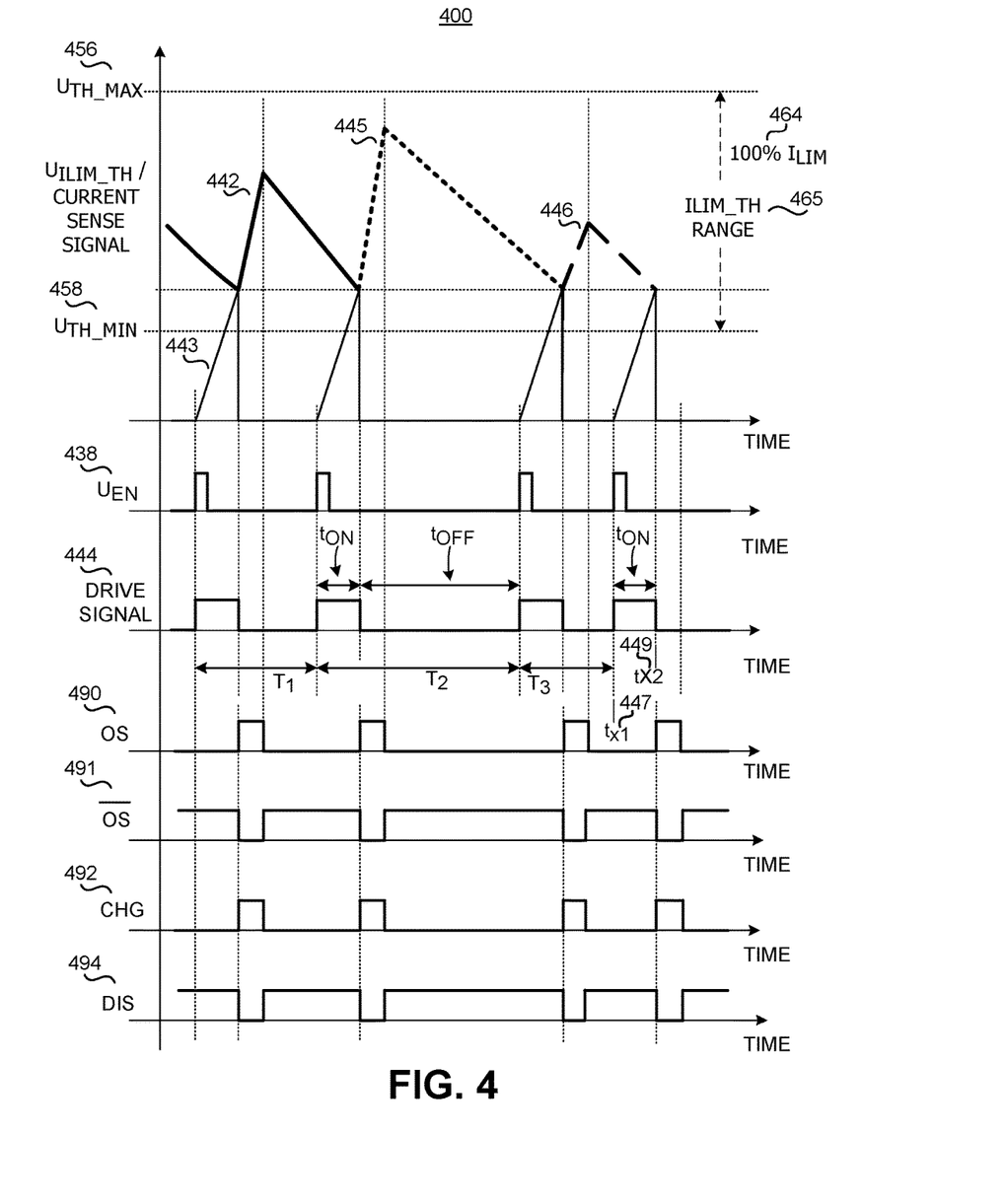
FIG. 4 is another timing diagram illustrating various example waveforms representing signals of the example controller of FIG. 2, in accordance with the teachings of the present invention.

Referring to FIG. 4, a timing diagram 400 that illustrates various example waveforms of signals of the controller 200 of FIG. 2 is shown in accordance with the teachings of the present invention. It should be appreciated that similarly named and numbered elements referenced below are coupled and function as described above. In the example depicted in FIG. 4, the current limit threshold range ILIM_TH RANGE 465 is the range of values between the minimum current limit threshold $U_{TH\_MIN}$ 458 to the maximum current limit threshold $U_{TH\_MAX}$ 456, which the current limit threshold generator 228 may vary the current limit threshold signal $U_{ILIM\_TH}$ 442, $U_{ILIM\_TH}$ 445, or $U_{ILIM\_TH}$ 446. In one example the entire current limit threshold range ILIM_TH RANGE 465 may be indicated by 100% $I_{LIM}$ 464.

The waveforms described in the timing diagram 400 illustrate that, in one example, current limit threshold signals $U_{ILIM\_TH}$ 442, $U_{ILIM\_TH}$ 445, or $U_{ILIM\_TH}$ 446 having various slopes. For each fixed time period during which one shot signal OS 490 is a logic high, the upward slope of current limit threshold signal may be different.

To illustrate, during the switching period T1, the current limit threshold signal $U_{ILIM\_TH}$ 442 increases at a first rate (proportional to the upward slope of the $U_{ILIM\_TH}$ 442). An enable event is received (as shown by the enable signal $U_{EN}$ 438 transitioning to a logic high value) by the latch 266 and the drive signal 444 transitions to a logic high value, which therefore turns ON the power switch S1 110. The current sense signal 443 (representative of the switch current $I_D$ 140) begins to increase from zero. The rate at which the switch current $I_D$ 140 and current sense signal 443 increases is proportional to the input voltage $V_{IN}$ of the power converter. When the current sense signal 443 reaches the current limit threshold signal $U_{ILIM\_TH}$ 442, the output of comparator 268 transitions to a logic high value, which resets latch 266 causing the drive signal 444 to transition to a logic low value and the power switch S1 110 is turned OFF. As shown, the time in which the drive signal 444 is logic high is referred to as the ON time ($t_{ON}$) of the power switch S1 110, and the time in which the drive signal 444 is logic low may be referred to as the OFF time ($t_{OFF}$) of the power switch S1 110. Once the power switch is turned OFF, the current sense signal 443 falls to zero.

At the falling edge of the drive signal 444 during switching period T1, the one shot signal OS 490 transitions to a logic high value for a fixed time period. During switching period T1, the value of the current limit threshold signal $U_{ILIM\_TH}$ 442 is less than the maximum current limit threshold $U_{TH\_MAX}$ 456 for the entirety of the fixed time period. As such, the output of comparator 268 is logic low and the charge signal CHG 292 is logic high for as long as the one shot signal OS 490 is logic high. Switch S2 274 is closed and the capacitor C2 280 is charged by current source $Q_C$ 272. As a result, the current limit threshold signal $U_{ILIM\_TH}$ 442 increases for as long as the charge signal CHG 292 is logic high.

As illustrated the current limit threshold signal $U_{ILIM\_TH}$ 442 increases, within the current limit threshold range ILIM_TH RANGE 465, with an increased rate during a fixed time period after the end of the ON time torr of the power switch. Referring back to FIG. 2, the increase rate for the current limit threshold signal $U_{ILIM\_TH}$ 442 is substantially proportional to the current $I_C$ provided by current source $Q_C$ 272 and the capacitance of capacitor C2 280. In particular, the maximum amount which the current limit threshold signal $U_{ILIM\_TH}$ 442 may increase by is substantially equal to the product of the magnitude of current $I_C$ and the fixed time period divided by the capacitance of capacitor C2 280. As shown in the illustrated example, the maximum amount that the current limit threshold signal $U_{ILIM\_TH}$ 442 may increase is less than the current limit threshold range ILIM_TH RANGE 465.

The inverted one shot signal $\overline{OS}$ 491 transitions to a logic high value as the one shot signal OS 490 transitions to a logic low value at the end of the fixed time period. The output of comparator 268 is logic low as long as the value of the current limit threshold signal $U_{ILIM\_TH}$ 442 is greater than the minimum current limit threshold $U_{TH\_MIN}$ 458. As illustrated, the current limit threshold signal $U_{ILIM\_TH}$ 442 decreases with a decrease rate until the current sense signal 443 reaches the current limit threshold signal $U_{ILIM\_TH}$ 442. Referring back to FIG. 2, the decreased rate is substantially proportional to the current $I_{DIS}$ provided by current source 276 and the capacitance of capacitor C2 280.

At the start of switching period $T_2$, the current limit threshold signal $U_{ILIM\_TH}$ 442 is still decreasing with the decrease rate. Another enable event is received (as shown by the enable signal $U_{EN}$ 438 transitioning to a logic high value at the start of switching period $T_2$), which sets the latch 266 and causes the drive signal 444 to transition to a logic high value, which turns ON power switch S1 110. When the current sense signal 443 reaches the current limit threshold signal $U_{ILIM\_TH}$ 442 (which is still decreasing), the output of comparator 268 transitions to a logic high value, which resets latch 266 and causes the drive signal 444 to transition to a logic low value, which turns OFF the power switch S1 110.

Continuing with the example depicted in FIG. 4, the one shot signal OS 490 transitions to a logic high value at the end of the ON time $t_{ON}$ during switching period $T_2$. To illustrate, during the switching period $T_2$, the current limit threshold signal $U_{ILIM\_TH}$ 445 increases at a second rate (proportional to the upward slope of the $U_{ILIM\_TH}$ 445). Similar to switching period T1, during switching period $T_2$ the value of the current limit threshold signal $U_{ILIM\_TH}$ 445 is less than the maximum current limit threshold $U_{TH\_MAX}$ 456 for the entirety of the fixed time period at which the one shot signal OS 490 is logic high.

As such, the charge signal CHG 492 is logic high for the entirety of the fixed time period and transitions to a logic low value when the one shot signal OS 490 transitions to a logic low value after the fixed time period. Or in other words, the charge signal CHG 492 substantially follows the one shot signal OS 490. At the end of the fixed time period (i.e., one shot signal OS 490 has transitioned to a logic low value and the inverted one shot signal $\overline{OS}$ 491 has transitioned to a logic high value), the current limit threshold signal $U_{ILIM\_TH}$ 445 decreases with the decrease rate until the minimum current limit threshold $U_{TH\_MIN}$ 458 or the current sense signal 443 reaches the current limit threshold signal $U_{ILIM\_TH}$ 442.

As shown in the depicted example, another enable event is received at the start of switching period $T_3$ and the current limit threshold signal $U_{ILIM\_TH}$ 445 is still decreasing with the decreased rate. Switching period $T_3$ is similar to switching period $T_2$. However, during the switching period $T_3$, the current limit threshold signal $U_{ILIM\_TH}$ 446 increases at a second rate R1 (proportional to the upward slope of the line). At the end of the fixed time period, the current limit threshold signal $U_{ILIM\_TH}$ 446 begins decreasing.

Another enable event is received at a time $t_{x1}$ 447, which may be the start of switching period $T_4$ (not shown), and as shown, the current limit threshold signal $U_{ILIM\_TH}$ 446 is still decreasing with the decrease rate. The drive signal 444 transitions to a logic high value and the power switch is turned ON. When the current sense signal 443 reaches the current limit threshold signal $U_{ILIM\_TH}$ 446, the output of comparator 268 transitions to a logic high value and the drive signal 444 transitions to a logic low value and the power switch is turned OFF.

The one shot signal OS 490 transitions to a logic high value at the time $t_{x2}$ 449. At the end of the ON time $t_{ON}$ during switching period $T_4$ (not shown; indicated by the time instant $t_{x2}$ 449), the value of the current limit threshold signal $U_{ILIM\_TH}$ 446 is less than the maximum current limit threshold $U_{TH\_MAX}$ 456. As such the output of comparator 268 is logic low and the charge signal CHG 492 is logic high. Switch S2 274 is turned ON and the current limit threshold signal $U_{ILIM\_TH}$ 446 begins to increase.

At the end of the fixed time period, the inverted one shot signal $\overline{OS}$ 491 transitions to a logic high value. The output of comparator 268 is logic low since the value of the current limit threshold signal $U_{ILIM\_TH}$ 446 is greater than the minimum current limit threshold $U_{TH\_MIN}$ 458. As a result the discharge signal DIS 494 is logic high and the switch S3 278 is closed and the current limit threshold signal $U_{ILIM\_TH}$ 446 decreases until the current sense signal 443 reaches the current limit threshold signal $U_{ILIM\_TH}$ 446 or the current limit threshold signal $U_{ILIM\_TH}$ 446 reaches the minimum current limit threshold $U_{TH\_MIN}$ 458.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:
1. A controller for use in a power converter, comprising:
 a drive circuit coupled to generate a drive signal to control switching of a power switch to control a transfer of energy from a power converter input to a power converter output;
 an input for receiving an enable signal including enable events responsive to the power converter output, wherein the drive circuit is coupled to turn ON the power switch in response to the enable events and turn OFF the power switch in response to a power switch current reaching a current limit threshold; and
 a current limit threshold generator coupled to receive the drive signal from the drive circuit and to vary the current limit threshold at a variable rate in response to the enable events of the enable signal, wherein the current limit threshold generator comprises a jitter generator.

2. The controller of claim 1, wherein the current limit threshold is increases at a variable rate and decreases at a fixed rate.

3. The controller of claim 1, wherein a time between successive enable events of the enable signal is responsive to the power converter output.

4. The controller of claim 1, wherein the enable events include transitions from one logic state to another logic state in the enable signal.

5. The controller of claim 1, wherein the current limit threshold generator is coupled to vary the current limit threshold in response to a time between successive enable events of the enable signal over a range of output loads coupled to the power converter output.

6. The controller of claim 1, wherein the current limit threshold generator is coupled to increase the current limit threshold at a variable rate in response to an end of each ON time of the power switch.

7. The controller of claim 1, wherein the current limit threshold generator is coupled to increase, within a current limit threshold range, the rate of the current limit threshold in a continuous fashion during a fixed time period in response to an end of each ON time of the power switch.

8. The controller of claim 1, wherein the jitter generator is coupled to increase the current limit threshold at a variable rate, within the current limit threshold range.

9. The controller of claim 1, wherein the current limit threshold generator includes a monostable multivibrator coupled to generate a one shot pulse to determine a fixed time period, wherein the monostable multivibrator is coupled to receive the drive signal to generate the one shot pulse in response to an end of each ON time of the power switch.

10. A controller for use in a power converter, comprising:
a drive circuit coupled to generate a drive signal to control switching of a power switch to control a transfer of energy from a power converter input to a power converter output;
an input for receiving an enable signal including enable events responsive to the power converter output, wherein the drive circuit is coupled to turn ON the power switch in response to the enable events and wherein the drive circuit is coupled to turn OFF the power switch in response to a power switch current reaching a current limit threshold; and
a current limit threshold generator coupled to receive the drive signal from the drive circuit to generate the current limit threshold, wherein the current limit threshold generator is coupled to increase, within a current limit threshold range, the current limit threshold at a variable rate during a fixed time period after an end of each ON time of the power switch, and wherein the current limit threshold generator is coupled to decrease the current limit threshold, within the current limit threshold range, after the fixed time period at a fixed decrease rate until the power switch current reaches the current limit threshold.

11. The controller of claim 10, wherein the drive circuit includes a latch coupled to generate the drive signal and coupled to be set in response to the enable events, wherein the drive circuit further includes a variable current source coupled to reset the latch in response to a comparison of a current sense signal representative of the power switch current and the current limit threshold.

12. The controller of claim 10, wherein the current limit threshold generator includes a monostable multivibrator coupled to generate a one shot pulse to determine the fixed time period, wherein the monostable multivibrator is coupled to receive the drive signal to generate the one shot pulse in response to the end of each ON time of the power switch.

13. The controller of claim 10, wherein the current limit threshold generator includes a capacitor coupled to generate the current limit threshold, wherein the capacitor is coupled to be charged by a first current source during the fixed time period if the current limit threshold is within the current limit threshold range, and wherein the capacitor is coupled to be discharged by a second current source after the fixed time period if the current limit threshold is within the current limit threshold range.

14. The controller of claim 13, wherein the second current source is coupled to be responsive to an input voltage coupled to the power converter input.

15. The controller of claim 13, wherein the second current source is coupled to discharge the capacitor at a first rate in response to a first value of the input voltage, and wherein the second current source is coupled to discharge the capacitor at a second rate in response to a second value of the input voltage.

16. The controller of claim 13, wherein the first current source includes a first current mirror coupled between the capacitor and a maximum current limit threshold reference voltage, and wherein the second current source includes a second current mirror coupled between the capacitor and a minimum current limit threshold reference voltage.

17. The controller of claim 13, wherein the first current mirror includes a p-type metal oxide semiconductor field effect transistor (MOSFET) coupled between the capacitor and the maximum current limit threshold reference voltage, and wherein the second current mirror includes an n-type MOSFET coupled between the capacitor and the minimum current limit threshold reference voltage.

18. The controller of claim 13, wherein a first mirror source is coupled to receive a variable current via a transistor.

19. The controller of claim 18, wherein a control terminal of the transistor is coupled to vary in response to a jitter signal by the jitter generator.

20. The controller of claim 13, wherein a magnitude of the increase rate is substantially greater than a magnitude of the decrease rate.

* * * * *